United States Patent
Tremelling et al.

(10) Patent No.: US 10,291,040 B2
(45) Date of Patent: May 14, 2019

(54) ENERGY STORAGE SYSTEM CHARGER WAKE-UP

(71) Applicant: NEC Energy Solutions, Inc., Westborough, MA (US)

(72) Inventors: Gregory Tremelling, Berlin, MA (US); Oleg Kerbel, Needham, MA (US); Yevgeny Maltsev, Hudson, MA (US); Ron Amit, Newton, MA (US)

(73) Assignee: NEC Energy Solutions, Inc., Westborough, MA (US)

( * ) Notice: Subject to any disclaimer, the term of this patent is extended or adjusted under 35 U.S.C. 154(b) by 176 days.

(21) Appl. No.: 14/636,534

(22) Filed: Mar. 3, 2015

(65) Prior Publication Data
US 2016/0261126 A1    Sep. 8, 2016

(51) Int. Cl.
*H02J 7/00*    (2006.01)
*H01M 10/42*   (2006.01)
(Continued)

(52) U.S. Cl.
CPC ......... *H02J 7/0026* (2013.01); *H01M 10/425* (2013.01); *H01M 10/441* (2013.01);
(Continued)

(58) Field of Classification Search
CPC ............. H02J 2007/0098; H02J 7/0021; H02J 7/0026; H02J 7/0029; H02J 7/0031; H02J 7/007
USPC ........................................................ 320/139
See application file for complete search history.

(56) References Cited

U.S. PATENT DOCUMENTS 4,965,738 A    10/1990  Bauer et al.
5,572,110 A    11/1996  Dunstan
(Continued)

FOREIGN PATENT DOCUMENTS

EP    0 779 571 A2    6/1997

OTHER PUBLICATIONS

Notification of Transmittal of the International Search Report and the Written Opinion of the International Searching Authority for PCT/US2016/020252, "Energy Storage System Charger Wake-Up", dated May 23, 2016.

(Continued)

*Primary Examiner* — Nathaniel R Pelton
(74) *Attorney, Agent, or Firm* — Hamilton, Brook, Smith & Reynolds, P.C.

(57) ABSTRACT

In an embodiment, an energy storage system includes one or more storage cells, charge/discharge circuitry, and charger wakeup circuitry. After the storage cells become depleted below an energy level threshold, the charge/discharge circuitry disconnects the storage cells from a main circuit associated with the storage system. The charger wakeup circuitry allows a limited amount of current to bypass the charge/discharge circuitry in order to present a current-limited voltage from the storage cells at the terminals. The voltage presented at the terminals is pulsed on and off when an external device is connected across the terminals. The voltage presented to the terminals is detected by the external device. After detecting the voltage, the external device performs an operation in response to detecting the condition.

26 Claims, 3 Drawing Sheets

(51) Int. Cl.
    *H01M 10/44*     (2006.01)
    *H01M 10/48*     (2006.01)
    *H03K 17/687*     (2006.01)

(52) U.S. Cl.
    CPC ........... H01M 10/482 (2013.01); H02J 7/007 (2013.01); H02J 7/0021 (2013.01); H02J 7/0031 (2013.01); *H02J 2007/004* (2013.01); *H02J 2007/0037* (2013.01); *H02J 2007/0067* (2013.01); *H02J 2007/0098* (2013.01); *H03K 17/6874* (2013.01)

(56) References Cited

U.S. PATENT DOCUMENTS

| | | | |
|---|---|---|---|
| 5,606,242 | A | 2/1997 | Hull et al. |
| 6,184,660 | B1 * | 2/2001 | Hatular .................. H02J 7/022 320/139 |
| 8,154,248 | B2 * | 4/2012 | Cruise ................. H01M 10/441 200/43.17 |
| 8,169,184 | B2 | 5/2012 | Li et al. |
| 8,692,513 | B2 * | 4/2014 | Gaul ................... B60L 11/1816 180/65.21 |
| 2012/0181987 | A1 * | 7/2012 | Lee ....................... H02J 7/0029 320/128 |
| 2014/0062387 | A1 | 3/2014 | Kim |
| 2015/0231976 | A1 * | 8/2015 | Byun ................... B60L 11/185 320/109 |

OTHER PUBLICATIONS

Notification of Transmittal of the Supplemental European Search Report, for EP 16 75 9353, dated Sep. 24, 2018, pp. 2.

* cited by examiner

ENERGY STORAGE SYSTEM CHARGER WAKE-UP

BRIEF DESCRIPTION OF THE DRAWINGS

The accompanying drawings, which are incorporated in and constitute a part of this specification, illustrate one or more embodiments described herein and, together with the description, explain these embodiments. The components of the drawings are not necessarily drawn to scale, the emphasis instead being placed upon illustrating principles of the present disclosure. In the drawings.

DETAILED DESCRIPTION

Figure 1:
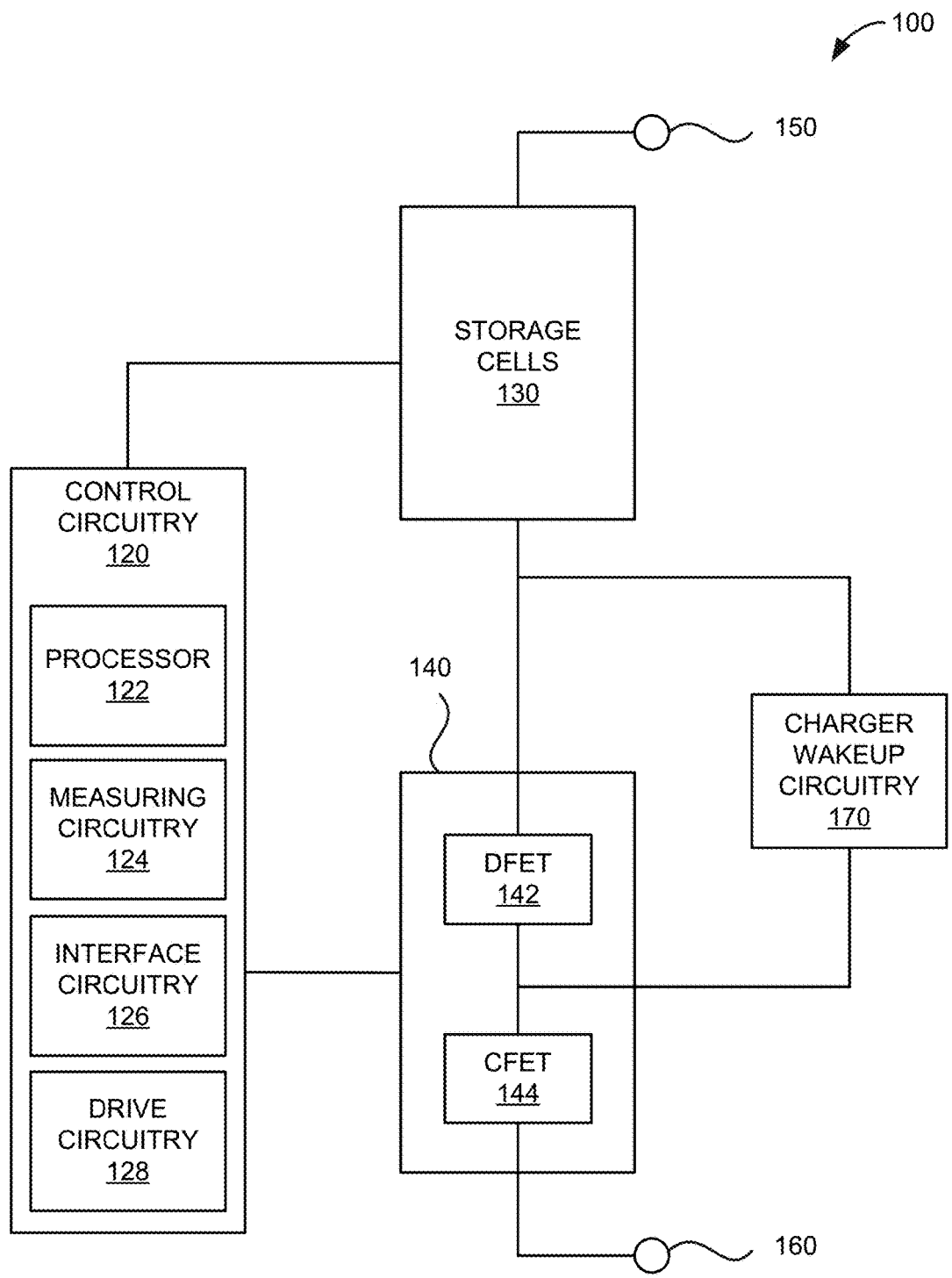
FIG. 1 illustrates an example of an energy storage system containing one or more storage cells for storing electrical energy.

An energy storage system may be used to store and provide energy such as, for example, electrical energy. Here, the energy storage system may include, for example, one or more storage cells that may be used to store and provide the electrical energy. The storage cells may store chemical energy which may be converted to electrical energy based on a chemical reaction that may take place within the storage cells. The electrical energy may be delivered to terminals that may be connected to the storage cells. Examples of storage cells that may be used in energy storage systems include lead-acid, nickel-cadmium (NiCd), nickel metal hydride (NiMH), and lithium ion (Li-ion) storage cells.

A device may be powered by energy provided by one or more storage cells. For example, an electric motor may be powered by electrical energy that may be provided by a series of storage cells. Powering a device using storage cells may cause the energy available from the storage cells to become depleted.

Some storage cells are rechargeable in that after delivering all or part of their stored energy, the storage cells may be recharged to restore all or part of their stored energy level. The storage cells may, for example, be recharged using a device that may provide energy to the storage cells to recharge them. A charger is an example of a device that may provide electrical energy to the storage cells to recharge them.

A charger may be designed to provide power at its output immediately after the charger is activated. For example, a charger may be designed to produce charging voltage and current at its output as soon as the charger is powered on. One issue with such charger is that it may become damaged or cause damage to its environment or nearby personnel if one or more of the storage cells are damaged.

To obviate issues that may be associated with chargers that provide power at their output immediately after the chargers are activated, a charger may be designed to provide power at its output only after a certain predefined condition is detected by the charger. Such chargers are often referred to as smart chargers.

For example, a smart charger may be designed to require a condition be met before the smart charger provides a charging power at its output. The condition may include, for example, that a certain voltage level be present across a storage cell's terminals connected to the smart charger and/or that one or more storage cells to be charged by the smart charger are undamaged (e.g., not shorted).

It may be difficult for systems that employ circuitry to, for example, protect storage cells contained in the system, to meet a condition in which the smart charger would begin charging the storage cells.

For example, suppose an energy storage system contains terminals, storage cells, and charge/discharge circuitry connected in series to form a main circuit which together deliver power to an external load connected to the terminals. Now suppose the charge/discharge circuitry detects the storage cells have discharged to a certain predefined energy level and disconnects the storage cells from the terminals thereby stopping the flow of energy to the external load. Further, suppose that after the storage cells are disconnected from the terminals by the charge/discharge circuitry, no voltage is present across the terminals.

Now suppose a charger is manually or automatically connected to the terminals to recharge the storage cells. Further, suppose that the charger requires a voltage to be present at the terminals before the charger provides a charging power at the terminals to recharge the storage cells. Since no voltage is present across the terminals after the storage cells have been disconnected from the main circuit by the charge/discharge circuitry, the charger may not provide the charging power to the terminals. Thus, connecting the charger to the terminals may not cause the storage cells to be recharged.

Techniques described herein may obviate issues that may arise when circuitry is used to, for example, disconnect one or more storage cells from terminals when the storage cells are depleted below a certain energy level threshold.

In an embodiment, an energy storage system includes one or more storage cells, terminals, charge/discharge circuitry, and charger wakeup circuitry. One pole of the storage cells is connected to one of the terminals. The other pole of the storage cells is connected to another terminal through the charge/discharge circuitry. The charge/discharge circuitry disconnects the storage cells after the storage cells are depleted below an energy level threshold.

The charger wakeup circuitry provides voltage to the terminals by making a current-limited electrical connection between the storage cells and the terminals. The current-limited electrical connection allows a small amount of current to bypass (i.e., not pass through) the charge/discharge circuitry. This small current presents a voltage at the terminals of the energy storage system. A charger such as, for example, a smart charger, attached to the terminals may sense the voltage and begin charging the storage cells. Moreover, providing the voltage to the terminals may be used as a diagnostic aid to determine the energy level in the storage cells. Here, for example, a voltmeter connected across the terminals can measure the storage cell's voltage.

In addition, the charger wakeup circuitry terminates the current-limited connection after a period of time. In this embodiment, the period of time is inversely proportional to an amount of current that an external device, connected to the terminals, draws from the energy storage system. The charger wakeup circuitry later reconnects the current-limited connection after a delay.

Moreover, if an electrical load produced by the external device is nearly zero (e.g., a resistance of the external device is high such that little current is drawn by the external device), the charger wakeup circuitry may produce a steady voltage across the storage system's terminals. In this embodiment, the steady voltage produced by the wakeup circuitry is roughly equal to the storage cell's terminal voltage. In situations where the electrical load produced by the external device is significant enough to discharge the cells (e.g., the resistance of the external device is low such that a significant amount of current is drawn by the load to continue discharging the cells at a fast rate), the charger wakeup circuitry may produce a pulsed voltage across the storage cell's terminals. Here, a duty cycle of the pulsed voltage and/or a width of a pulse in the pulsed voltage may be defined based on a magnitude of a resistance of the external device. In this embodiment, the width of the pulse is inversely proportional to the resistance of the external device.

Furthermore, techniques described herein may be used in configurations where multiple energy storage systems are wired in series to form a series string. The charger wakeup circuit of, for example, each energy storage system may be used to coordinate a synchronous behavior of the energy storage systems in the series string.

For example, the charger wakeup circuitry of, for example, each energy storage system may generate voltage pulses. The voltage pulses may be used by an energy storage system to synchronize its current-limited connection with other energy storage systems in the series string. An external device may be connected between the most negative terminal and the most positive terminal of the series string. After the voltage pulses are synchronized among the series-connected energy storage systems, the voltage pulses may be presented to the external device. The external device may detect the voltage pulses and perform an operation in response to detecting the voltage pulses. The operation may include, for example, charging one or more storage cells contained in the energy storage systems.

FIG. 1 illustrates an example of an energy storage system 100 for storing electrical energy. Referring to FIG. 1, energy storage system 100 may include various components such as, for example, control circuitry 120, storage cells 130, charge/discharge circuitry 140, and charger wakeup circuitry 170. It should be noted that FIG. 1 is an example of an energy storage system that may be implement one or more techniques described herein. Other energy storage systems that implement one or more techniques described herein may include more components or fewer components than illustrated in FIG. 1.

A main circuit associated with energy storage system 100 may include terminal 150, storage cells 130, discharge field-effect transistor (DFET) 142, terminal 160, and an external device that is connected across terminals 150 and 160. The main circuit may be used to transfer power between the storage cells 130 and the external device.

The external device may be, for example, a charging device, a monitoring device, a measuring device, and/or some other device. A charging device may include a device that may be used to charge the storage cells. An example of a charging device is a battery charger that may be used to charge batteries that may be contained in the storage cells. A monitoring device may include a device that may be used to monitor an output of the storage cells. Other devices may include a hybrid-device that may perform one or more of the above operations. For example, a voltmeter may include provisions for monitoring and measuring a voltage that may be output by the storage cells. Similarly, certain chargers may include provisions for monitoring, measuring, and charging the storage cells. It should be noted that monitoring, measuring, and charging are examples of operations that may be performed by an external device and that an external device associated with an energy storage system such as, for example, energy storage system 100, may perform other operations.

Control circuitry 120 may include logic that may provide various control features for energy storage system 100. The control features may include, for example, providing an external interface for energy storage system 100 with an external system, monitoring various characteristics (e.g., voltage) of storage cells 130, and/or controlling an operation of charge/discharge circuitry 140.

Control circuitry 120 may include a processor 122, measuring circuitry 124, interface circuitry 126, and/or drive circuitry 128. The processor 122 may be a microprocessor that may execute computer-executable instructions to perform various functions to manage the storage cells. These functions may include, for example, determining an energy level contained within the storage cells 130 and controlling an operation of the charge/discharge circuitry 140 based on the determined energy level.

The measuring circuitry 124 may include circuitry that may measure (e.g., determine) an energy level contained within the storage cells 130. The measuring circuitry 124 may provide the measured energy level to the processor 122.

Processor 122 may use the measured energy level to (1) determine whether the storage cells 130 have been depleted below a predefined energy level threshold and (2) control an operation of the discharge circuitry based on the determination. For example, if the processor 122 determines that the measured energy level contained within the storage cells 130 is equal or lower than a predefined energy level threshold, the processor 122 may direct the charge/discharge circuitry 140 to disconnect the storage cells 130 from the terminals.

The interface circuitry 126 may interface the control circuitry 120 with an external device. For example, the interface circuitry 126 may include circuitry that interfaces the processor 122 with a controller area network (CAN) bus. The processor 122 may transfer information (e.g., a measured energy level within the storage cells, and/or status information) via the CAN bus to an external device such as, for example, an external computer.

The drive circuitry 128 may be used to control an operation of the DFET 142 and charge field-effect transistor (CFET) 144. For example, DFET 142 and CFET 144 may act as switches that may connect and disconnect storage cells 130 to and from terminal 160. The drive circuitry 128 may include circuitry that may control an operation of DFET 142 and CFET 144 based on one or more signals that may be generated by processor 122.

Storage cells 130 may contain one or more storage cells (e.g., batteries) that may store the energy. Storage cells contained in storage cells 130 may include, for example, one or more of lead-acid, NiCd, NiMH, and Li-ion storage cells.

Voltage from the storage cells 130 may be present at terminals 150 and 160. For example, storage cells 130 may produce a voltage. The voltage may be provided to terminal 150 via a direct connection and to terminal 160 via DFET 142. The voltage provided to terminal 150 may be positive with respect terminal 160 or negative with respect to terminal 160.

The charge/discharge circuitry 140 may include circuitry associated with charging and/or discharging the storage cells 130. Charge/discharge circuitry 140 may include DFET 142 and CFET 144. DFET 142 and CFET 144 may be power field-effect transistors (FETs) which may act as switches that connect and disconnect storage cells 130 to and from, respectively, terminal 160. DFET 142 and CFET 144 will be described further below.

Note that DFET 142 and CFET 144 may include body diodes which may allow reverse current to pass through DFET 142 and CFET 144 when they are turned off. The current that is passed by the body diodes may be reverse of that which may pass through DFET 142 and CFET 144 when they are turned on. For example, after being turned on, DFET 142 may allow a current to pass from terminal 160 to the storage cells 130. After being turned off, DFET 142 may block this current, however, a body diode associated with DFET 142 may allow reverse current to pass from the storage cells 130 to terminal 160. Similarly, after being turned on, CFET 144 may allow a current to pass from the storage cells 130 to terminal 160. After being turned off, CFET 144 may block this current, however, a body diode associated with CFET 144 may allow reverse current to pass from terminal 160 to the storage cells 130.

The charger wakeup circuitry 170 may include circuitry for generating a condition that may be used to "wake up" a charger that may be connected to system 100. Waking up the charger may, for example, cause the charger to begin charging storage cells 130.

It should be noted that chargers that may be used with techniques described herein may include chargers that draw energy from various sources. The drawn energy may be used by the charger to charge storage cells 130.

For example, a charger may draw electrical energy that may be provided by a power grid which is maintained by an electrical power utility company. The charger may use the drawn electrical energy to charge storage cells 130.

Other sources of energy that may be drawn by the charger may include, for example, electrical energy that may be generated from energy sources such as solar, wind, rain, tides, waves, and/or thermal heat. For example, the charger may draw electrical energy from a solar array that may convert solar energy to electrical energy. The drawn energy may be used by the charger to charge storage cells 130.

As will be described further below, waking up the charger may include, for example, the charger wakeup circuitry 170 generating a condition that may be detected (e.g., sensed) by the charger. The generated condition may include, for example, one or more voltage pulses or a steady voltage level present on the terminals, 150 and 160. The one or more voltage pulses or steady voltage level may be generated by charger wakeup circuitry 170 in a predetermined pattern with respect to, for example, time and voltage. In response to detecting the condition, the charger may begin charging the storage cells 130.

Figure 2:
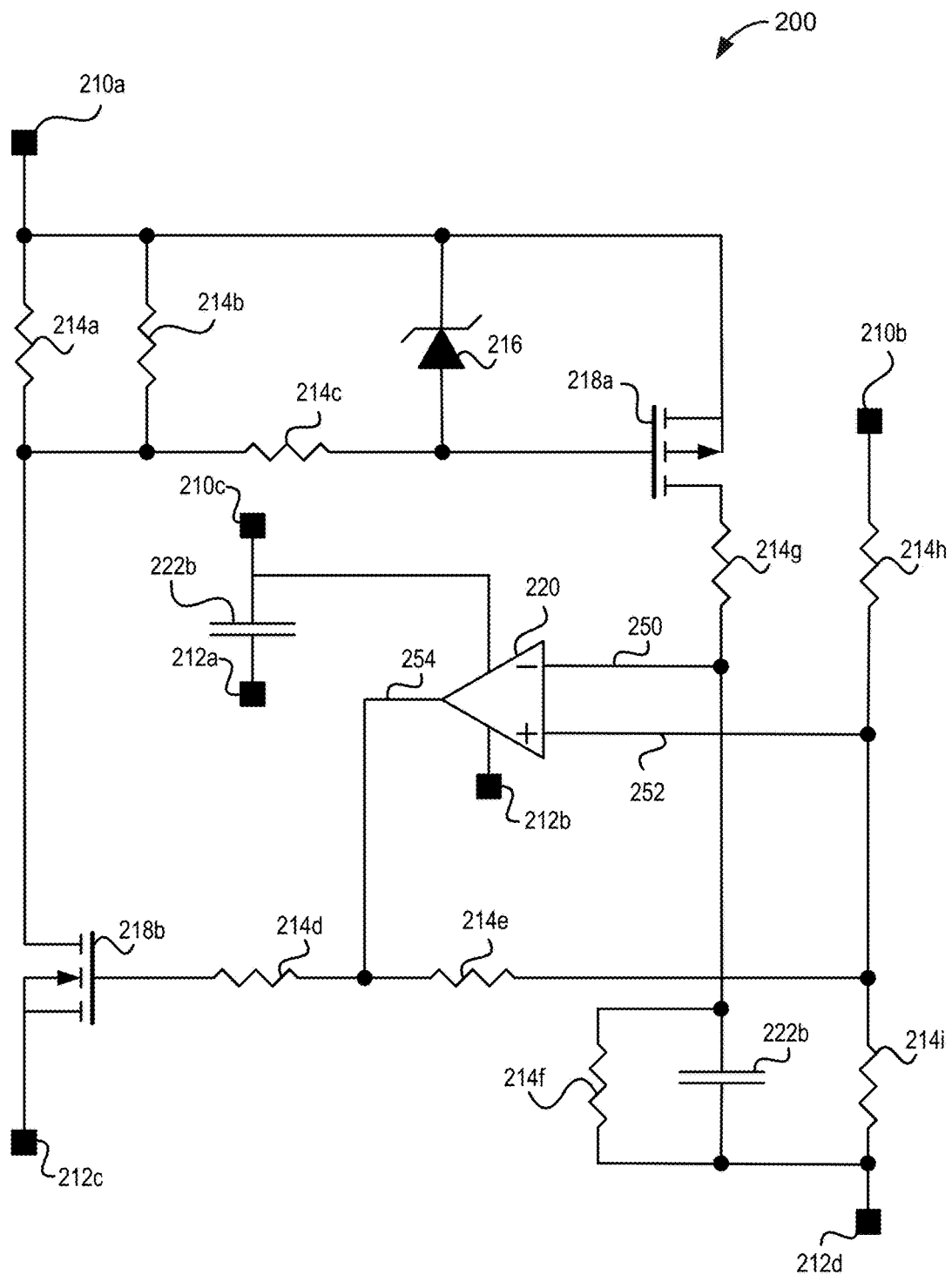
FIG. 2 illustrates an example of electronic circuitry that may be used to implement features associated with charger wakeup circuitry that may be contained in an energy storage system.

FIG. 2 illustrates an example of an electronic circuit 200 that may be included in and may implement one or more features provided by charger wakeup circuitry 170. It should be noted that FIG. 2 illustrates an example of an electronic circuit that may be included in and may implement one or more features provided by charger wakeup circuitry 170 and that other circuits that may be included in and may implement one or more features provided by charger wakeup circuitry 170 may be used.

Referring to FIG. 2, charger wakeup circuitry 170 may include various components such as terminal 210*a*, supply terminals 210*b-c*, return terminals 212*a-d*, resistors 214*a-i*, Zener diode 216, FETs 218*a-b*, comparator 220, and capacitors 222*a-b*. It should be noted that other embodiments of charger wakeup circuitry 170 may include more components or fewer components than the components illustrated in FIG. 2. Moreover, components contained in other embodiments of charger wakeup circuitry 170 may be different than the components illustrated in FIG. 2.

Current may enter the circuit 200 at terminal 210*a*. The current may be provided by a load connected across terminals 150 and 160. Supply terminals 210*b-c* may be connected to a supply voltage that may be used to power electronic circuit 200. The supply voltage may be provided by storage cells 130 and may be post-regulated by a voltage regulator to provide a consistent voltage.

Return terminals 212*a-d* may be connected to a return path for the electrical energy provided to supply terminals 210*b-c*. The return path may be a return path associated with storage cells 130. For example, in an embodiment, return terminals 212*a-d* are connected to a ground that is used as a return path for storage cells 130.

Resistors 214*a-i*, Zener diode 216, FETs 218*a-b*, comparator 220, and capacitors 222*a-b* may allow voltage present on the storage cells 130 to be provided across terminals 150 and 160. This voltage may be detected, for example, by a charger that may be connected to system 100. Note that the voltage provided across terminals 150 and 160 may be provided in constantly or discontinuously. For example, in an embodiment the voltage is a fixed voltage that is provided constantly across terminals 150 and 160. In another embodiment, the voltage provided across terminals 150 and 160 is provided for finite periods of time, separated by periods of no voltage and repeated.

For example, referring now to FIGS. 1 and 2, suppose control circuitry 120 directs drive circuitry to generate signals to turn off DFET 142 and turn on CFET 144 in order to enter a charge mode of operation to charge storage cells 130. After DFET 142 is turned off and CFET 144 is turned on, the charger wakeup circuitry 170 may enter a cyclic mode of operation that involves producing a voltage that may be detected by a charger connected to the system 100.

Specifically, a cycle may begin after DFET 142 is turned off and a load is connected across terminals 150 and 160. Current from the connected load enters the circuit 200 at 210*a* and passes through FET 218*b* (which is pre-disposed to be on), resistors 214*a-b* and back to the storage cells 130 via 212*c*. As the current flows through resistors 214*a-b* a voltage begins to develop across the resistors 214*a-b*. After this voltage is reaches a certain predefined value, FET 218*a* turns on.

After FET 218*a* is turned on, some of the current flowing through an external device connected across terminals 150 and 160 (FIG. 1) flows through FET 218*a*, resistor 214*g* and capacitor 222*b* as it completes the circuit back to the storage cells 130 via 212*d*. This current causes capacitor 222*b* to charge. As capacitor 222*b* charges, its voltage rises and causes a voltage at input 250 of comparator 220 to rise at a rate determined by a time constant associated with the values of resistor 214*fg*, a resistance of the external device (load resistance), and capacitor 222*b*.

After the voltage at input 250 exceeds a voltage at input 252 of comparator 220, a voltage at an output 254 of comparator 220 causes FET 218*b* to turn off. Turning off FET 218*b* causes FET 218*a* to turn off which stops the flow of current from the load through 214*g* and into capacitor 222*g*. After this current ceases, capacitor 222*b* discharges at a rate determined by the time constant associated with the values of resistor 214*f* and capacitor 222*b*. After capacitor 222*b* has discharged to below the voltage at input 252 of comparator 220, FET 218*b* turns on and the cycle repeats.

While FET 218*a* is on, a limited current is allowed to flow through the external device. The current is limited by the values of resistor 214*g*, 214*a*, and the load resistance. A large load resistance (e.g., with respect to the resistance of resistors 214*a-b*) may cause FET 218*a* to not turn on and a constant voltage may be presented to the external device at terminals 150 and 160. A small load resistance (e.g., with respect to the resistance of resistors 214*a-b*) may allow a significant amount of current to drain from the storage cells. This may cause a discontinuous voltage (e.g., pulses) to be generated and presented at the terminals 150 and 160 discontinuous. A duty cycle and/or pulse width of the discontinuous voltage may be dependent on the load resistance (e.g., dependent on a magnitude of the load resistance).

Note that the above-described circuit 200 may allow a continuous or discontinuous voltage to be present across terminals 150 and 160 after DFET 142 is turned off. The external device connected across terminals 150 and 160 may detect this voltage. After detecting the voltage, the external device may perform an operation such as, for example, provide charging power that may be used to charge the storage cells 130. The charging power may be provided to the storage cells 130 via the body diode associated with DFET 142 even though DFET 142 is turned off. Moreover, note that CFET 144 may remain on to permit charging even while the DFET 142 is preventing further discharge of the storage cells 130.

For example, referring back to FIG. 1, suppose that storage cells 130 have discharged to a certain predetermined energy level threshold and that a smart charger is connected across terminals 150 and 160. Control circuitry 120 may measure the voltage output of storage cells 130, determine that the storage cells have been depleted to the predetermined energy level threshold based on the measurement, and turn DFET 142 off to prevent further discharging of the storage cells 130 via the main circuit.

Charger wakeup circuitry 170 may provide a steady voltage across terminals 150 and 160. This steady voltage which may be detected by the smart charger. The steady voltage may, for example, be current limited and periodically interrupted by the charger wakeup circuitry 170 to obviate drawing more energy from the storage cells 130 than may be necessary to cause the external device to detect the voltage. After detecting the steady voltage, the smart charger may produce an output (e.g., charging power) that may be used to charge the storage cells 130.

Figure 3:
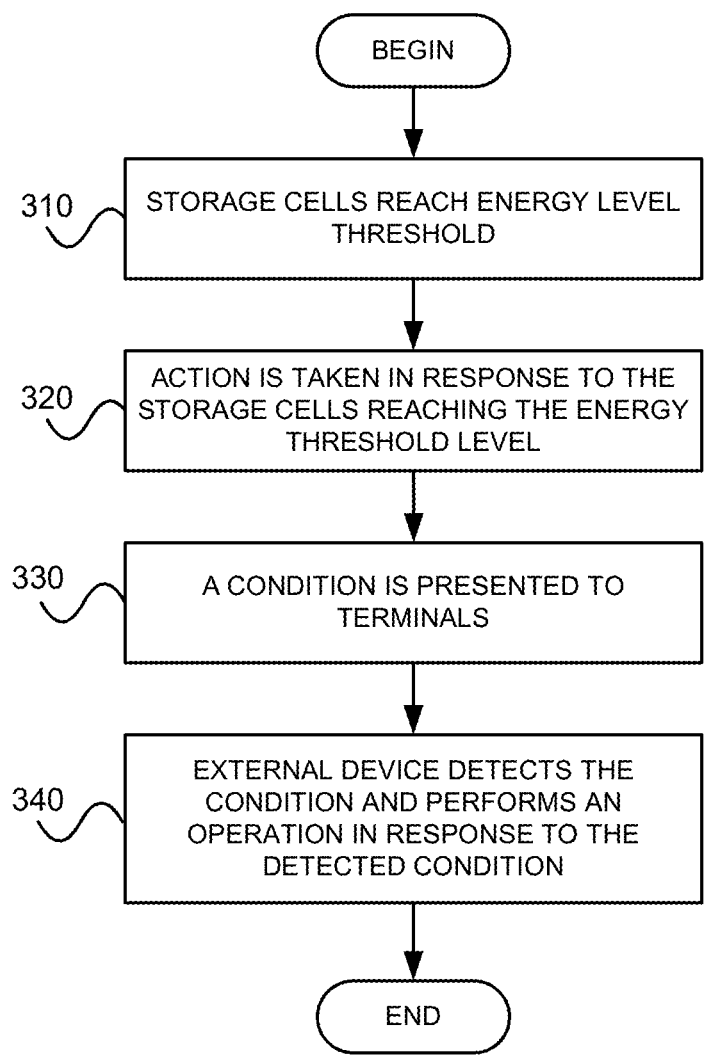
FIG. 3 illustrates example acts that may be performed by an energy storage system to enable the charging of storage cells contained in the energy storage system.

FIG. 3 illustrates example acts that may be performed by an energy storage system such as, for example, energy storage system 100, to charge storage cells such as, for example, storage cells 130, which may be contained in the energy storage system.

Referring to FIG. 3, at block 310 the storage cells discharge to a point that the energy level of the storage cells reaches a predefined energy level threshold. Such a condition may be detectable, for example, by comparing the storage cells' voltage to a predefined voltage that represents the predefined energy level threshold. Note, however, that other techniques may be used to detect this condition. The predefined energy level threshold may be defined based on various criteria. For example, the predefined energy level threshold may be an energy level to which the storage cells may safely discharge and/or that to which the storage cells may discharge before being considered ready to be recharged.

At block 320, the energy storage system takes action in response to the storage cells reaching the energy threshold level. The action may include, for example, charge/discharge circuitry contained in the energy storage system disconnecting the storage cells from terminals associated with the energy storage system. The terminals, storage cells, and discharge circuitry may be connected in series. The charge/discharge circuitry may include circuitry (e.g., a DFET) that may be used to disconnect the storage cells from the terminals.

At block 330, a condition is presented to the terminals. For example, the energy storage system may include circuitry that may generate a condition at the terminals. The condition may wake up an external device connected to the terminals. The condition may include, for example, a steady voltage or voltage pulses which can be detected by the external device.

At block 340, the external device detects the presented condition and performs an operation in response to the detected condition. The operation may include, for example, one or more of: (1) generating an output (e.g., charging power) which may be provided to the terminals to charge the storage cells, (2) measuring an output of the storage cells, and (3) monitoring an output of the storage cells. It should be noted that other operations may be performed by the external device.

The following example may be helpful in understanding the above. Referring now to FIGS. 1-3, suppose, for example, that an energy level threshold for storage cells 130 is a predefined voltage value and that the storage cells 130 have discharged to a point where their voltage is at or below the predefined voltage value. Further suppose that an external device is connected across terminals 150 and 160.

Measuring circuitry 124 may measure the voltage of the storage cells 130 and determine that the storage cells 130 have discharged to a point that the storage cells 130 have reached the energy level threshold. In response to this determination, processor 122 may direct drive circuitry 128 to turn DFET 142 off thereby disconnecting the storage cells 130 from terminal 160. Processor 122 may also direct drive circuitry 128 to turn on CFET 144 to provide a path to the storage cells 130 from terminal 160 via CFET 144. The provided path may be used to charge storage cells 130.

In addition, control circuitry 120 may provide an indication that the energy level of the storage cells 130 has been depleted to at least the energy level threshold. The indication may be provided, for example, by processor 122 or other electronic circuits to an external device (e.g., computer, display device) via interface circuitry 126.

After DFET 142 is turned off and CFET 144 is turned on, charger wakeup circuitry 170 may generate a condition based on an electrical resistance of the external device. The condition may include, for example, presenting one or more voltage pulses and/or a steady voltage across terminals 150 and 160. The voltage pulses and/or steady voltage may be presented in a pattern with respect to time. The pattern may depend on the electrical resistance of the external device. Moreover, a duty cycle and/or a pulse width of the one or more voltage pulses may depend on the electrical resistance of the external device. For example, the duty cycle and/or the pulse width of the one or more voltage pulses may be defined based on a magnitude of the resistance of the external device.

The charger may detect the condition generated by the charger wakeup circuitry 170 and in response to detecting the condition may provide charging power at terminals 150 and 160. The charging power may be used to recharge the storage cells 130.

The foregoing description of embodiments is intended to provide illustration and description, but is not intended to be exhaustive or to limit the invention to the precise form disclosed. Modifications and variations are possible in light of the above teachings or may be acquired from practice of the invention. For example, while a series of acts has been described above with respect to FIG. 3, the order of the acts may be modified in other implementations. Further, non-dependent acts may be performed in parallel.

No element, act, or instruction used herein should be construed as critical or essential to the invention unless explicitly described as such. Also, as used herein, the articles "a" and "an" are intended to include one or more items. Where only one item is intended, the term "one" or similar language is used. Further, the phrases "based on" and "determined by" are intended to mean "based, at least in part, on" and "determined, at least in part, by" respectively, unless explicitly stated otherwise.

It is intended that the invention not be limited to the particular embodiments disclosed above, but that the invention will include any and all particular embodiments and equivalents falling within the scope of the following appended claims.

What is claimed is:

1. An apparatus comprising:
   at least one storage cell;
   multiple terminals operable to output energy from the at least one storage cell;
   control circuitry to monitor a level of energy stored in the at least one storage cell;
   a discharge switch disposed in a circuit path between the at least one storage cell and a first terminal of the multiple terminals, the control circuitry operable to control a state of the discharge switch to an OFF state in response to detecting that the level of energy is below a threshold value, the OFF state of the discharge switch preventing current to flow from the at least one storage cell through the discharge switch to the first terminal;
   a bypass circuit to provide a limited current to flow from the at least one storage cell to the first terminal during a condition in which the discharge switch is controlled to the OFF state; and
   a charge switch controlled by the control circuitry, the charge switch operable to convey current received at the first terminal to the at least one storage cell;
   wherein the bypass circuit is connected to a circuit node coupling the charge switch to the discharge switch; and
   wherein the charge switch is disposed in series with the discharge switch.

2. The apparatus of claim 1, wherein the bypass circuit is operable to provide the limited current from the at least one storage cell to the first terminal to cause a charging device to charge the at least one storage cell.

3. The apparatus of claim 1, wherein the limited current results in a steady voltage to appear across the multiple terminals.

4. The apparatus of claim 1, wherein the limited current results in voltage pulses to appear across the multiple terminals.

5. The apparatus of claim 4, wherein a duty cycle of the voltage pulses is based on a magnitude of a resistance of a charger device coupled to the multiple terminals.

6. The apparatus of claim 4, wherein a pulse width of the voltage pulses is based on a magnitude of a resistance of a charger device coupled to the multiple terminals.

7. The apparatus as in claim 1, wherein the limited current causes a voltage to appear at the output terminals, the voltage presented at the output terminals for sensing by a charger coupled to the output terminals, the charger operable to charge the at least one storage cell in response to detecting the voltage at the output terminals.

8. The apparatus as in claim 1, wherein the bypass circuit is disposed in parallel with the discharge switch.

9. The apparatus as in claim 1, wherein the control circuitry is operable to control the charge switch to an ON state subsequent to controlling the discharge switch to the OFF state.

10. The apparatus as in claim 1, wherein the bypass circuit produces the limited current to notify a charger to charge the at least one storage cell.

11. The apparatus of claim 1, wherein the first terminal is operable to receive charge from a charging device in response to the bypass circuit providing the limited current flow to the first terminal.

12. The apparatus as in claim 1, wherein a duration of time in which the bypass circuit provides the limited current to flow to the first terminal depends on an amount of current drawn by an external device coupled to the first terminal.

13. The apparatus as in claim 1, wherein the discharge switch is disposed in series between the charge switch and the at least one storage cell.

14. The apparatus as in claim 1, wherein the bypass circuit includes a switch to convey the limited current from the at least one storage cell to the first terminal.

15. The apparatus as in claim 1, wherein the multiple terminals are operable to output the energy from the at least one storage cell to an external load coupled to the multiple terminals when the discharge switch is controlled to an ON state.

16. The apparatus as in claim 1, wherein a combination of the at least one storage cell, the multiple terminals, the control circuitry, the discharge switch, and the bypass circuit is an energy storage system through which the at least one storage cell is chargeable via a charging device coupled to the multiple terminals.

17. A method comprising:
    monitoring a level of energy stored in at least one storage cell;
    detecting that the energy stored in the at least one storage cell is below an energy threshold level;
    controlling a state of a discharge switch to an OFF state in response to detecting that the level of energy is below the energy threshold level, the OFF state of the discharge switch preventing current to flow from the at least one storage cell through the discharge switch to a first output terminal;
    controlling a bypass circuit to provide a limited current to flow from the at least one storage cell to the first terminal during a condition in which the discharge switch is controlled to the OFF state;
    temporarily terminating the flow of the limited current; and
    resuming generation of the limited current through the bypass circuit to the first output terminal after a time delay.

18. The method of claim 17, wherein the limited current results in presentation of voltage pulses at the output terminals.

19. The method of claim 18, wherein a duty cycle of the voltage pulses is dependent on a resistance of a device coupled to the output terminals.

20. The method of claim 18, wherein a pulse width of the voltage pulses is dependent on a resistance of a device coupled to the output terminals.

21. The method of claim 17, wherein the limited current results in presentation of a steady voltage at the output terminals.

22. The method as in claim 17 further comprising:
receiving charge from a charger device coupled of the first terminal during a condition in which the discharge switch is controlled to the OFF state; and
conveying the received charge to the at least one storage cell.

23. A system comprising:
an energy storage system to store energy;
output terminals to convey the energy from the energy storage system as an output voltage to an external device;
control circuitry to monitor a level of energy stored in the energy storage system;
a discharge switch disposed in a circuit path between the energy storage system and a first terminal of the output terminals, the control circuitry operable to control a state of the discharge switch to an OFF state in response to detecting that the level of energy is below a threshold value, the OFF state of the discharge switch preventing current to flow from the energy storage system through the discharge switch to the first terminal;
a bypass circuit to provide a limited current to flow from the energy storage system to the first terminal of the output terminals during a condition in which the level of the energy stored in the energy storage system is below the threshold value, the limited current resulting in presentation of the output voltage at the output terminals;
a charge switch controlled by the control circuitry, the charge switch operable to convey current received at the first terminal to the energy storage system;
wherein the bypass circuit is connected to a circuit node coupling the charge switch to the discharge switch; and
wherein the charge switch is disposed in series with the discharge switch.

24. The system of claim 23, wherein the output voltage at the output terminals includes voltage pulses.

25. The system of claim 24, wherein a duty cycle of the voltage pulses is dependent on a magnitude of a resistance of the charger.

26. The system of claim 24, wherein a pulse width of the voltage pulses is dependent on a magnitude of a resistance of the charger.

* * * * *